Sept. 22, 1964 R. N. NOYCE 3,150,299

SEMICONDUCTOR CIRCUIT COMPLEX HAVING ISOLATION MEANS

Filed Sept. 11, 1959 2 Sheets-Sheet 1

INVENTOR.
ROBERT N. NOYCE
BY
Lippincott & Ralls
ATTORNEYS

INVENTOR.
ROBERT N. NOYCE
BY
Lippincott & Ralls
ATTORNEYS 3,150,299

SEMICONDUCTOR CIRCUIT COMPLEX HAVING ISOLATION MEANS

Robert N. Noyce, Los Altos, Calif., assignor, by mesne assignments, to Fairchild Camera and Instrument Corporation, Syosset, N.Y., a corporation of Delaware Filed Sept. 11, 1959, Ser. No. 839,446
4 Claims. (Cl. 317—235)

The present invention relates to unitary solid-state electronic circuits and, more particularly, to a base or complex defining isolated semiconductor zones which are thus avaiable for modification and connection to form circuits. The invention also relates to an improved and simplified method of manufacturing semiconductor circuit complexes.

The advantages of providing unitary solid-state electronic circuits are well recognized, however, the difficulties providing requisite electrical isolation between elements thereof, while maintaining a simplified structure of low manufacturing cost, has limited advances in this field. Although unitary solid-state circuits have been formed, at least some are limited in application by the imperfect isolation afforded between separate zones or elements thereof, and many suffer from difficulties of manufacture resulting in high cost of the articles.

The present invention provides a simplified circuit complex with a straightforward method of manufacture employing only standard production steps of the semiconductor art. Additionally, the semiconductor circuit complex hereof provides a very high degree of electrical isolation between zones defined therein for modification into desired circuit elements. The foregoing is herein accomplished by the utilization of high resistance material as an integral part of the unitary complex, and the combination of same in various manners with conductive semiconducting material to afford different degrees of electrical isolation of different applications of the invention.

The term "intrinsic" is hereinafter employed in connection with semiconducting to denote a high resistance material such as silicon, as is provided by the pure material or proper treatment thereof, while the term "extrinsic" is employed in connection with semiconducting material to denote a material having acceptor or donor impurities therein providing semiconducting properties thereto.

The present invention, in brief, provides a unitary circuit complex having extrinsic semiconducting zones therein separated by intrinsic barriers to electrically isolate such zones. In this respect, pure silicon is noted to have a resistivity of 300,000 ohms per centimeter, and this high resistance is herein utilized as an isolating barrier. It is also provided that the intrinsic barrier of the complex may be combined with extrinsic barrier zones of selected polarity of dispose P–N junctions in conjunction with the high resistance barrier as a further isolation. As regards isolation for alternating current signals, the invention provides for the physical separation of the P and N surfaces of a junction by intrinsic material to thereby minimize the capacitive effect of the junction. The circuit complex hereof may be readily and inexpensively manufactured by the method of this invention, as such method includes only conventional process steps well known in the semiconductor art.

It is an object of the present invention to provide an improved semiconductor circuit complex utilizing intrinsic material to afford maximized electrical isolation between zones defined therein.

It is another object of the present invention to provide a simplified method of manufacturing semiconductor circuit complexes wherein only diffusion processing is included.

It is a further object of the present invention to provide an improved semiconductor circuit complex having a plurality of extrinsic semiconductor zones adapted for individual modification into circuit elements, and providing maximum isolation between such zones for all types of signals and voltages that may be provided upon such zones.

It is yet another object of the present invention to provide a semiconductor circuit complex with non-capacitive electrical isolation between zones defined therein for modification into semiconductor circuit elements.

Various other possible objects and advantages of the present invention will become apparent to those skilled in the art from the following description of the invention, however, no limitation is intended by the terminology of same and instead reference is made to the appended claims for a precise delineation of the true scope of the present invention.

The invention is illustrated both as to structure and method of manufacture in the accompanying drawings, wherein.

Figure 1:
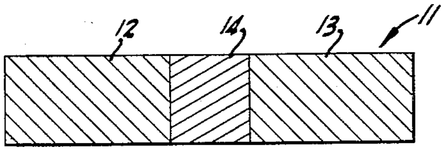
FIG. 1 is a simplified schematic representation in cross section of a circuit complex in accordance with the present invention.

Considering now particular preferred embodiments of the present invention, reference is made to FIG. 1 of the drawings, wherein there is schematically illustrated a simplified semiconductor circuit complex formed as a thin wafer 11 of monocrystalline semiconducting material such as silicon, for example. The wafer 11 is illustrated in FIG. 1 as being composed of a pair of extrinsic semiconductor zones 12 and 13 separated by a barrier or barrier zone 14 or intrinsic semiconducting material. This simplified circuit complex provides two extrinsic semiconducting zones 12 and 13 which may be modified as desired to form diodes or transistors therefrom, for example, and which are electrically isolated from each other by the barrier of intrinsic semiconducting material 14. Under those conditions and temperatures wherein the barrier 14 retains high resistance characteristics, there is thus seen to be afforded a substantial electrical isolation between the extrinsic zones 12 and 13, so that circuit elements formed of these zones are maintained out of electrical contact with each other by the semiconductor circuit complex structure.

Figure 2:
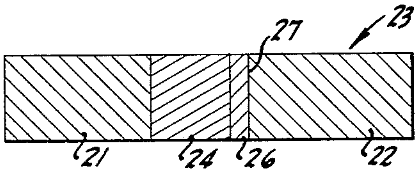
FIGS. 2, 3 and 4 are schematic representations in cross section of alternative embodiments of semiconductor circuit complexes in accordance with the present invention.

An alternative embodiment of the present invention, which is particularly desirable for applications wherein the resistivity of the intrinsic material of a barrier of the complex may decrease under operating conditions, is illustrated in FIG. 2. This embodiment of the present invention is also particularly adapted for preventing the passage of alternating current signals between separate zones of the complex, as noted in more detail below. The simplified structure of the circuit complex of FIG. 2 includes a monocrystalline wafer 23, having a pair of extrinsic semiconducting zones 21 and 22 extending therethrough, and separated by a barrier 24 of intrinsic semiconducting material. There is additionally provided as a part of the circuit complex of this embodiment, a further barrier or internal wall 26 extending through the wafer 23 and disposed between the intrinsic barrier 24 and one of the extrinsic zones 22. In the example hereof wherein the zones 21 and 22 are formed of an N-type semiconducting material, the barrier 26 is formed of a P-type semiconducting material. This extrinsic semiconducting barrier 26 is preferably coextensive with the intrinsic barrier 24 to the extent that each of the semiconducting zones of the wafer 23 which are adapted for utilization as circuit elements are separated from each other by a combination of barriers 24 and 26. This extrinsic barrier 26 has a sufficient thickness to prevent the establishment of transistor action therethrough and normally a thickness in excess of the diffusion length of minority carriers therein is sufficient. As regards the isolation afforded between zones 21 and 22, for example, by the double barriers 24 and 26 hereof, it will be seen that a P–N transistor junction 27 exists between the zone 22 and barrier zone 26. There is also, in effect, provided a second P–N junction between the zone 21 and barrier 26, with the intrinsic barrier 24, however, being inserted therein. The two P–N junctions noted above will be seen to be oriented in back-to-back relation, i.e., oppositely oriented insofar as the passage of current therethrough is concerned. Consequently, these two oppositely oriented junctions, which may be likened to a pair of oppositely oriented semiconducting diodes, provide a high impedance with the flow of current in either direction between the zones 21 and 22. Such diodes are well known to be voltage dependent so that insofar as alternating current voltages are concerned, they may be considered as capacitive or possibly more properly as being by-passed by equivalent capacitances. In the embodiment of the present invention illustrated in FIG. 2, a substantial separation is afforded between the adjacent edges of the zones 21 and barrier 26 by the interposition of the intrinsic barrier 24 therebetween. This intrinsic barrier thus serves to substantially remove the capacitance which may otherwise be considered to by-pass the semiconducting diode between the zone 21 and barrier 26. As a consequence of this physical configuration, the isolation afforded between the zones 21 and 22 is no longer voltage dependent and a very substantial isolation is afforded for alternating current voltages as well as direct current voltages. In this embodiment of the invention the intrinsic zone 24 will be seen to serve the dual purpose of providing a relatively high resistance between the extrinsic semiconducting zones of the complex and, furthermore, to provide a substantial separation between otherwise adjacent edges or surfaces of semiconducting material of opposite conductivity types so as to materially decrease the capacitance existing between such surfaces. The extrinsic barrier hereof in combination with the intrinsic barrier provides a desired impedance even at elevated temperatures where the intrinsic resistance decreases.

Figure 3:
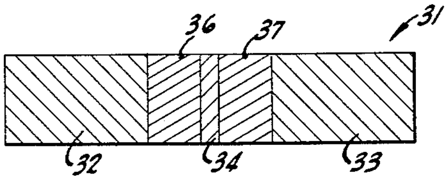

Even greater isolation may be provided between separate semiconducting zones in a semiconductor circuit complex in accordance with the present invention by the substantial removal of the capacitance of both of the semiconducting diodes established between such zones. This is herein accomplished by the insertion of a barrier of opposite semiconductivity type between the intrinsic barrier and each of the extrinsic zones. Structure suitable for accomplishing this result is illustrated in FIG. 3 wherein a wafer 31 will be seen to include a pair of zones 32 and 33 formed of extrinsic semiconducting material of desired conductivity type. In the illustrated embodiment of the invention it is assumed that the conductivity type of both of the zones 32 and 33 are alike. Isolation of these zones 32 and 33 is herein afforded by the provision of a barrier 34 of extrinsic semiconducting material extending transversely through the wafer 31 and disposed intermediate the zones 32 and 33. This barrier 34 is formed of an extrinsic semiconducting material of different conductivity type from that of the zones 32 and 33; thus in the example herein considered, the zone 34 is assumed to be a P-type semiconductor in the instance wherein the zones 32 and 33 are N-type semiconductors. On opposite sides of the extrinsic barrier 34 there is provided a pair of intrinsic semiconducting barriers 36 and 37 individually interposed between the zone 32 and the barrier 34, and between the zone 33 and the barrier 34. An electrical circuit analogy to the circuit complex, illustrated in simplified form in FIG. 3, indicates that the zones 32 and 33 are electrically separated by a pair of semiconducting diodes in oppositely oriented relation. Thus, the adjacent surfaces of the zone 33 and barrier 34 will be seen to comprise in effect a junction or semiconducting diode disposed in back-to-back relationship with a like junction or diode formed by the adjacent surfaces of the zone 32 and the barrier 34. The intrinsic barriers 36 and 37 form a separation between the adjacent surfaces of such diodes. As a consequence of this structure, each of the diodes will be seen to have a substantial separation between what might otherwise be considered plates of a capacitor and such separation is furthermore provided by a high resistance element. Consequently, the capacitive dependence of these diodes is substantially nullified and relatively complete isolation is provided between the zones 32 and 33 for both direct current and alternating current voltages.

Figure 4:
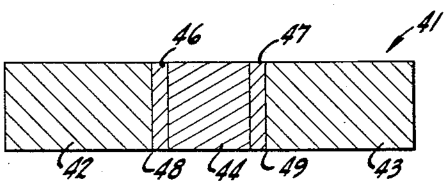

In FIG. 4 there is illustrated yet another embodiment of a semiconductor circuit complex in accordance with the present invention. A wafer 41 is therein illustrated in simplified form as including at least a pair of separate zones 42 and 43 formed of extrinsic semiconducting material having a like semiconductivity type, such as N-type silicon. Between the zones 42 and 43 there is disposed a barrier zone 44 of intrinsic semiconducting material extending transversely through the wafer 41 to thereby fully separate the zones 42 and 43 from each other. Interposed between the barrier zone 44 and the extrinsic semiconducting zones 42 and 43, there are provided a pair of extrinsic barrier zones 46 and 47 formed of a semiconducting material of an opposite conductivity type to that of the zones 42 and 43. These extrinsic barriers 46 and 47 extend transversely through the wafer 41, as does the intrinsic barrier zone 44, to thereby additionally divide the wafer 41. As regards the electrical circuit equivalency of the above-described structure there will be seen to be provided a junction 48 between the zone 42 and barrier 46 and likewise to be formed another junction 49 between the zone 43 and barrier 47. These junctions, which may be considered as diodes, will be seen to be disposed in opposite orientation and to be electrically connected through the high resistance of the intrinsic barrier zone 44. Isolation between the zones 42 and 43 of the wafer will thus be seen to be provided by the equivalent of a pair of semiconducting diodes connected back-to-back with a substantial resistance inserted between such diodes in the connection. For direct current signals, the diodes will be seen to form a high impedance path between the zones 42 and 43 inasmuch as whichever the direction of current flow, such current must flow in a reverse direction through at least one of the diodes. As regards alternating current signals, the diodes form a substantial impedance between the zones, and additionally the intrinsic barrier zone 44 disposed between the diodes serves to provide a high resistance in the connection. This embodiment differs from those of FIGS. 2 and 3 in that capacitive effects of the diodes are not herein cancelled and thus the application of this structure is limited to instances where such is not necessary.

Figure 6:
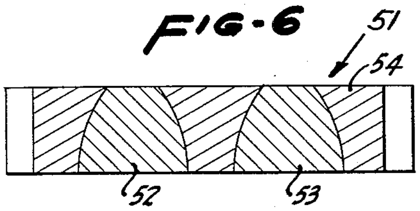
FIG. 6 is a sectional view taken in the plane 6—6 of FIG. 5.
Figure 5:
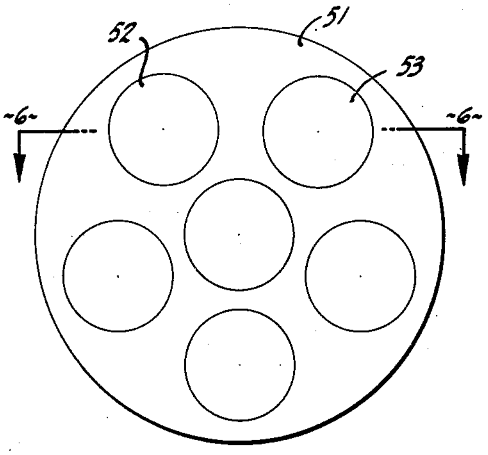
FIG. 5 is an plan view of a circuit complex in accordance with the present invention.

It is to be appreciated that in the above-described embodiments of the present invention, the semiconductor circuit complex may include a large plurality of separate and isolated semiconducting zones of extrinsic semiconductor material of like or dissimilar conductivity type, and that the above-described illustrations are only exemplary and are, in fact, simplified in the interests of clarity. In actual practice of the present invention, the boundary between adjacent zones and barriers of the circuit complex often have a configuration other than the straight line separation indicated in the above-described figures. It is preferable to form the various extrinsic zones and barriers of the circuit complex hereof by the diffusion of selected impurities into a semiconducting wafer in accordance with the method of the present invention set forth below, and such diffusion may normally be most simply accomplished from a single side of the wafer whereby a relatively curved interface is provided between the zones and barriers of the wafer. In this respect, attention is invited to FIGS. 5 and 6 of the drawings wherein there is illustrated a wafer 51 including a substantial number of separate extrinsic semiconducting zones therein with the zones 52 and 53 thereof, for example, being formed of semiconducting material of either like or opposite conductivity type or polarity. The zone 52 may, for example, be formed of a P-type silicon and the zone 53 of an N-type silicon. Electrically, the P-type zone 52 may be considered as having a plurality of positive charges along the face thereof adjacent the intrinsic zone 54, and, conversely, the N-type zone 53 may be considered as having a plurality of free negative charges along the face thereof adjacent the zone 54. Insofar as capacitive effects are concerned, these relatively positive and negative faces or surfaces within the wafer 51 will be seen to be substantially separated by the intrinsic barrier 54. The adjacent surfaces of the zones 52 and 53 may also be considered as forming a P–N junction which will readily conduct current in one direction and provide a high impedance to the flow of current in the opposite direction. In the instance wherein the zone 53 is electrically maintained at a positive potential with respect to the zone 52, this junction then provides a high impedance to the flow of current between the zones and, furthermore, the intervening intrinsic barrier 54 substantially limits the capacitive coupling between these zones. Electrically biasing the zones 52 and 53 in an opposite polarity substantially eliminates the impedance to current flow afforded by the junction therebetween; however, the intrinsic barrier 54 may yet provide a sufficient resistance between the zones so that only limited current flow is possible. The same situation will be seen to be present for the application of alternating current voltages between the zones 52 and 53, for upon one-half cycle of such voltages the junction between the zones is oppositely biased, while the other half cycle of alternating current will forward bias the junction. It will be appreciated from the above description that particular semiconductor circuit complexes in accordance herewith, have advantages over alternate configurations hereof for certain electrical applications of the circuit complex. Thus, it will be seen that the physical structure of the circuit complex illustrated in FIG. 6, for example, is materially simplified over that of certain other embodiments of the present invention, and thus for those circuit applications wherein sufficient isolation is afforded by this structure, it is preferable to employ same rather than the more complicated structures of the other embodiments. Alternatively, particular electrical circuitry which may be formed with the semiconductor circuit complex of the present invention, may impose very strict isolation requirements so that one of the more elaborate isolation configurations illustrated in the drawings is preferable. In this respect also, a single semiconductor circuit complex may include a combination of the separate embodiments of the present invention. Where but a single zone of the circuit complex, for example, need be highly isolated from the remainder of the complex, and much lesser isolation requirements are imposed between the remaining zones of the complex, the physical configuration of the embodiment of FIG. 3, for example, may be employed in connection with such single zone, while somewhat simpler isolation arrangements in accordance with the present invention may be employed between the remaining zones of the complex.

The above-described semiconductor circuit complex including the various alternative embodiments thereof will be seen to each include an intrinsic semiconducting barrier. As previously noted, the resistance of intrinsic silicon, for example, is very high at normal temperatures so that only a relatively narrow zone or barrier thereof between extrinsic semiconducting zones of the complex will provide a substantial resistance between these latter zones. While it may be possible to form the semiconductor circuit complex of the present invention in a variety of ways, yet particular advantage lies in the utilization of the method of the present invention in connection therewith. It is first noted in this respect that each of the embodiments of the circuit complex hereof is initiated, insofar as the manufacture thereof is concerned, from a wafer or blank of intrinsic semiconducting material. Truly intrinsic semiconducting material contains no impurities, and thus it will be appreciated that the diffusion of impurities therein, particularly of the acceptor and donor type, removes the intrinsic properties of the material and, in fact, makes such material extrinsic. The basic theory of semiconductors is to be found in various standard publications on the subject, and thus is not included herein. The presence of minute or trace amounts of acceptor or donor impurities in semiconducting material serves to very substantially reduce the resistivity of such material and to, in fact, preclude same from being truly intrinsic. Thus, the method of the present invention includes steps for insuring substantial intrinsic high resistance qualities of the semiconducting material employed as the wafer of the circuit complex hereof.

Figure 7:
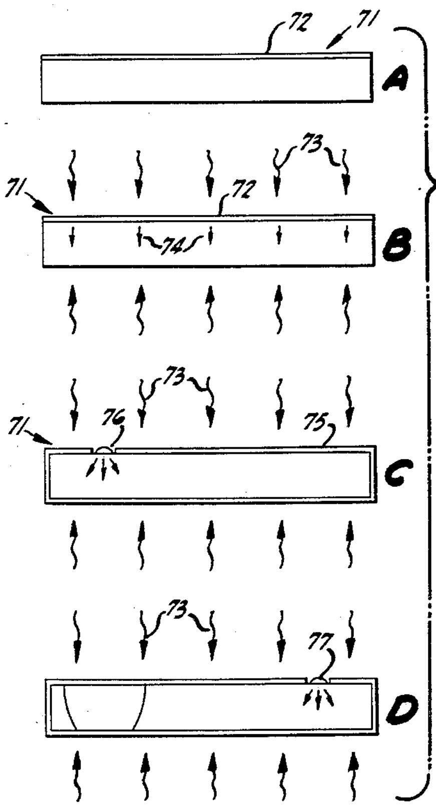
FIG. 7 is a schematic illustration at A, B, C and D thereof of a semiconductor circuit complex at various stages of manufacture in accordance with the process of this invention.

Referring to FIG. 7, there is illustrated at FIG. 7A a wafer 71 of substantially pure monocrystalline semiconducting material such as silicon. In the event that this silicon is truly intrinsic, i.e., has been purified to the extent wherein substantially no acceptor or donor impurities are present therein to reduce the resistivity thereof, such material may be directly employed in accordance with the subsequent steps of the method of the present invention to produce the circuit complex hereof. In the alternative circumstance, wherein some slight trace of either acceptor or donor impurities remains in the silicon wafer 71, the method hereof provides for the swamping out of the acceptor and/or donor characteristics of the silicon by the diffusion therein of a deep level impurity. Deep level impurities are those providing energy levels adjacent the center of the forbidden band of a semiconductor and not only fail to impart acceptor or donor characteristics, but in fact, serve to overcome or swamp out such characteristics. An example of a suitable deep level impurity which may be employed in the process of the present invention is gold. Thus, there is illustrated at FIG. 7A a deep level impurity such as gold, disposed in a layer 72 upon the upper surface of the water 71. This layer 72 may be provided upon the wafer 71 in any convenient manner such as, for example, by evaporation and need have only a very minimal thickness. Diffusion of the deep level impurity of the layer 72 into the wafer 71 is accomplished by the application of heat, as indicated by the arrows 73 in FIG. 7B. Deep level impurities rapidly diffuse into semiconducting material and thus a sufficient quantity of such impurity may be diffused throughout the wafer 71 quite rapidly. Diffusion of the impurity is illustrated by the minute arrows 74 of FIG.

7B and it is only necessary to uniformly diffuse into the wafer 71 a sufficient amount of the deep level impurity such as gold, to overcome the effect of the donor or acceptor impurity which may be present therein. The effect of a donor or acceptor impurity is overshadowed by the deep level impurity diffused into the wafer and there is produced by such diffusion a substantially intrinsic semiconducting material. The resistivity of the wafer 71 following diffusion of an appropriate amount of gold, or other deep level impurity therein, is substantially that of truly intrinsic semiconducting material obtained by complete purification of same and thus for the purposes of the present invention, material so treated is herein considered to be intrinsic.

Following the production of an intrinsic wafer 71 there is then controllably diffused selected impurities into the wafer to form such zones therein of extrinsic semiconducting material as may be desired to form the semiconductor circuit complex of the present invention. As illustrated in FIG. 7C, the wafer 71 may be provided with an oxide coating 75, for example silicon oxide, with an opening etched or otherwise formed therein for the diffusion of a selected impurity therethrough. This coating 75 serves to protect the surface of the wafer 71 and to limit the area of the wafer into which the selected impurity is diffused. In the event that an N-type zone is to be formed in the wafer 71, a donor impurity 76 is diffused into the wafer through the opening in the mask or layer 75. This donor impurity is chosen from one of the elements in Group V of the Periodic Table and may comprise an element such as phosphorus or antimony. The diffusion of the impurity 76 into the wafer 71 is carried out by the application of heat, indicated by the arrow 73, and through suitable known methods of control, the extent of the diffusion is limited. In the present instance it is desired that the impurity 76 shall diffuse transversely through the wafer 71 so that the resultant N-type zone therein defined shall also extend transversely through the wafer. Additional zones are diffused into the intrinsic semiconducting material of the wafer 71 by the diffusion of selected donor and acceptor impurities therein in the manner briefly outlined above. Thus, at FIG. 7D there is illustrated the diffusion of another zone having a conductivity type which may, for example, be opposite to that of the zone produced by the diffusion of the impurity 76. In this instance, for the establishment of a zone or region of P-type semiconducting material, an impurity 77 chosen from Group III of the Periodic Table is diffused through another opening formed in the mask 75 by the application of heat to the wafer and impurity contacting same. A suitable acceptor impurity for diffusion into silicon to form P-type regions or zones therein is the element boron.

The diffusion steps of the method of the present invention may be carried out in accordance with known processes and thus each of the minute steps and portions thereof normally associated with the production of particular type semiconducting zones in a wafer of silicon, for example, are herein excluded from the explanation in the interests of clarity. As to the diffusion of the selected impurities 76 and 77 into the intrinsic semiconducting material of the wafer 71, such diffusion may be advantageously carried out by the utilization of gaseous impurities, inasmuch as the control of the diffusion rate is much more readily accomplished under these circumstances. It is important in the instance wherein gaseous impurities are utilized that a complete masking of the wafer 71 be accomplished with the exception of the particular area into which the impurity is intended to be diffused. As a further point in this connection, limitation of lateral diffusion of impurities by oxide masks is not effective when the element gallium is employed as the diffusing impurity. It has been found that gallium readily diffuses through oxide masks so that a different type of mask or other steps must be employed when gallium is utilized as a diffusing impurity. With the exception of gallium, the majority of available elements in the Groups III and V of the Periodic Table are suitably masked by oxide coatings. It is to be appreciated in connection with the illustration of the present invention that the transverse thickness of the wafer into which selected impurities are diffused is herein shown out of proportion in order to properly illustrate the invention. In practice, the thickness of the intrinsic silicon wafer is made extremely minute, again in accordance with good practice in the field of semiconductors.

Figure 8:
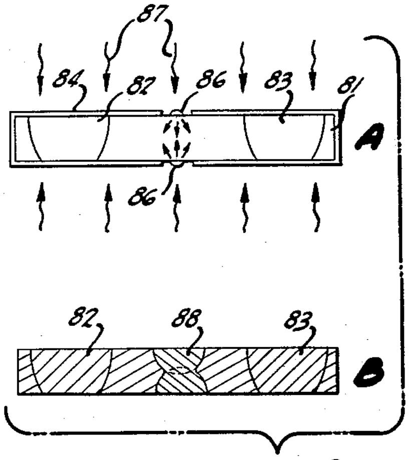
FIG. 8 illustrates at A and B thereof a semiconductor circuit complex at separate stages of manufacture of one particular embodiment thereof.

With regard to the establishment of relatively narrow barriers or barrier zones of a conductivity type which differs from the semiconducting zones of the wafers intended to be employed as circuit elements of the complex, it is desirable to diffuse the selected acceptor or donor impurity into the intrinsic material of the wafer from both sides thereof in order to limit the lateral extent of diffusion. It is well known that a diffusion of impurities into a wafer generally occurs at substantially equal rates in all directions from the point or area of origin thereof. Thus, in the instance wherein an impurity is physically contacted with a limited area of the surface of a semiconducting wafer, and appropriate heat is applied thereto, there will result a diffusion into the wafer of the impurity in all directions therefrom, both laterally and transversely into the wafer. It will be appreciated that in order to limit this lateral extent of the diffusion and yet at the same time to attain diffusion entirely through the wafer, it is preferable to diffuse the impurity into the wafer from opposite sides thereof. This portion of the process is illustrated in FIG. 8 wherein a wafer of intrinsic semiconducting material 81 is illustrated as including a pair of zones 82 and 83 of extrinsic semiconducting material of the same desired conductivity type and wherein a mask 84 is provided in substantially enveloping relationship to the wafer. In the instance that the intrinsic semiconducting material is intrinsic silicon, this mask 84 may be formed of silicon oxide which is generated in situ by the application of water vapor or the like to the surface of the wafer, or in other suitable conventional ways. The production of an extrinsic barrier zone transversely through the wafer between the zones 82 and 83 therein may be accomplished in accordance herewith by the provision of an opening through the mask 84 atop the wafer 81 and a like opening through the mask 84 beneath the wafer 81, said two openings being in alinement transversely through the wafer. A suitable impurity, illustrated for convenience as solids 86, is disposed in contact with the intrinsic semiconducting material of the wafer 81 within the openings in the mask 84 thereon. The application of heat, as indicated by the arrows 87, serves to diffuse the impurity into the wafer 81, with such diffusion proceeding at somewhat of an equal rate in all directions inwardly of the wafer from the point of contact of the impurity therewith. By the diffusion of the impurity into opposite sides of the wafer, it is only necessary to continue the diffusion until a substantial contact is made adjacent the center of the wafer by the impurities diffusing therein from opposite sides of the wafer. Thus, as illustrated at FIG. 8B, there is formed a barrier 88 transversely through the wafer 81 between the zones 82 and 83 which will be seen to be indicated as a pair of overlapping diffusion zones extending inwardly of the wafer from opposite sides thereof. In this manner the lateral extension of diffusion is limited and, consequently, a narrower barrier is possible of achievement than could be attained from only one side of the wafer. It will be seen that the physical structure of the semiconductor circuit complex illustrated in FIG. 8B is in actuality the counterpart of the semiconductor circuit complex schematically illustrated in FIG. 3 wherein a pair of extrinsic semiconductor zones are separated by an extrinsic barrier zone of opposite polarity thereto, and having on each side thereof, separating same from the first mentioned zones, appropriate barriers of intrinsic semiconducting material.

Figure 9:
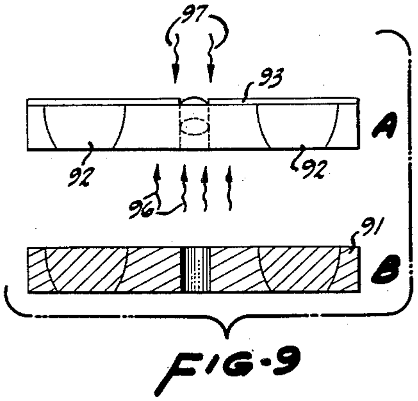
FIG. 9 illustrates at A and B thereof a process of forming metallic contacts transversely through the wafer of a semiconductor circuit complex as may be employed in conjunction with the complex configurations of FIGS. 1 through 4.

In the production of electrical or electronic circuits from the semiconductor circuit complex described above, there may be employed a wide variety of method and means for modifying the individual extrinsic semiconducting zones of the complex and for providing suitable connections between same or individual portions of same. It will be appreciated that in the circumstance wherein the zones and barriers of the semiconductor complex hereof extend transversely through the wafer of the complex, both sides of the wafer are available for modification of the zones into desired circuit elements and for the application of electrical conductors as is appropriate in accordance with the particular electronic circuit under consideration. While it is possible to employ an extrinsic semiconductor zone which has been heavily doped with impurity as a conducting medium through the wafer for the provision of electrical connection between elements formed of the complex, it is preferable—at least in certain instances—to provide other means for making electrical connections through the wafer. In this respect, attention is invited to FIG. 9 of the drawings wherein there is illustrated a method of forming an electrical connection through a semiconducting wafer. As illustrated in FIG. 9, there is provided a wafer 91 formed of intrinsic semiconducting material and having therein a plurality of zones of extrinsic semiconducting material 92, formed, for example, in accordance with the method of the present invention set forth above. A suitable high conductivity path for electrical current may be provided through the wafer 91 by doping a limited volume of the wafer extending transversely therethrough very heavily with a deep level of impurity, such as gold, for example, as it is possible to directly diffuse certain selected deep level impurities such as gold directly through a semiconducting wafer. There may, in accordance with the process of providing such a diffusion, be disposed a mask 93 of a material such as silicon oxide upon a wafer of intrinsic silicon. A small dot of a deep level impurity, such as gold, indicated by the numeral 94, is placed in direct contact with a surface of the intrinsic semiconducting material of the wafer 91 within the aperture of the mask 93. By the application of heat to the wafer to establish a substantial temperature gradient therethrough, a controlled diffusion of the gold may be accomplished. Thus, in accordance therewith, there is applied heat as indicated by the arrows 96, beneath the wafer 91 and a lesser amount of heat, as indicated by the arrows 97, atop the wafer 91 to thereby establish a temperature differential between a very high temperature under surface of the wafer and a lower temperature upper surface of the wafer. The mechanism herein involved is that the silicon dissolves in the gold with the droplet of gold 94 settling downward in the silicon, as same dissolves in front of the gold until the droplet emerges from the opposite side of the wafer. This phenomenon is elsewhere described in the literature and is herein included only as an indication of various operations which may be performed in connection with the semiconductor circuit complex hereof in the manufacture of electronic circuits from the complex. Consequently, no detailed explanation of the directional diffusion of material such as gold is believed necessary at this point, it being sufficient to note that following the operation briefly stated above, there is produced through the wafer 91 a heavily doped region or channel wherein the intrinsic silicon contains a sufficient amount of gold diffused therein to establish a very high conducting region through the wafer. Such a conducting channel may be advantageously employed herein where a high resistance wafer is utilized as the basis for the semiconductor circuit complex, inasmuch as such a channel is then resistively isolated from other portions of the circuit complex by the surrounding intrinsic semiconducting material.

Figure 10:
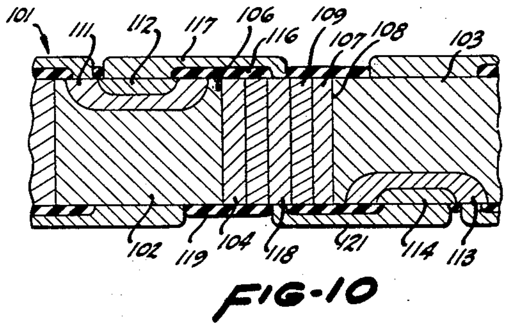
FIG. 10 is a partial, sectional view of a unitary solid-state electronic circuit incorporating the complex of the present invention.

As previously noted, the semiconductor circuit complex herein provided is not limited to any particular electronic circuitry and consequently no attempt is made herein to define individual electronic circuits. There is, however, illustrated as an example in FIG. 10 of the drawings certain possible connections and modifications which may be employed with the semiconductor circuit complex hereof. In FIG. 10 there is illustrated a portion of a semiconducting wafer 101 including a zone 102 of extrinsic semiconducting material diffused therein in accordance with the above-described method and spaced apart laterally of the wafer from another zone of extrinsic semiconducting material 103. For example, these zones 102 and 103 may be formed of an N-type semiconducting silicon produced by the controlled diffusion of antimony into a wafer of silicon. Immediately adjacent the zone 102 there is provided a barrier zone 104 of P-type silicon formed in accordance with the steps illustrated in FIG. 8 by the controlled diffusion of an impurity such as boron, into the wafer. This barrier 104 extends completely through the wafer 101 transversely thereof and forms with the zone 102 a P–N junction 106, which may be electrically considered as a semiconducting diode oriented to normally provide a low resistance to the flow of current from the barrier 104 to the zone 102. A like barrier 107 of P-type semiconducting silicon is disposed adjacent the zone 103 to form a P–N junction 108 therebetween. It will be seen that this P–N junction 108 may be also likened to a semiconducting diode oriented to readily conduct current from the P-type barrier 107 to the N-type zone 103, so that it is electrically disposed in opposite orientation to the diode formed by the junction 106 above mentioned. Between the two barriers of extrinsic semiconducting material 104 and 107, there is disposed a barrier zone 109 of intrinsic semiconducting material extending completely through the wafer 101 and fully separating the barriers 104 and 107 as well as the zones 102 and 103, which are displaced outwardly therefrom as regards this intrinsic barrier zone. As noted above, the electrical anology of this isolation afforded between the extrinsic semicondcting zones 102 and 103 of N-type semicondcting material is similar to a pair of semiconducting diodes formed by the junctions 106 and 108 disposed in back-to-back relation with a substantial resistance inserted therebetween so that for direct current and alternating current signals there is afforded a substantial high impedance between the zones 102 and 103. It is thus possible with this substantial isolation of the zones 102 and 103 to proceed to modify such zones in desired manners to form appropriate circuit elements therefrom. Thus, there may be diffused into the zone 102 an acceptor impurity to establish a transistor base 111 therein and a further diffusion of a donor impurity into such base region to thereby form a transistor emitter 112 therein. The major portion of zone 102 thus will be seen to comprise the collector element of a transistor formed from such zone and a similar operation may be performed upon the zone 103 with the diffusion in this instance being accomplished, for example, from the underside of the wafer 101 in contrast to the diffusion from the upper side thereof into the zone 102 as illustrated. There may thus be formed a transistor of the zone 103 with a major portion thereof forming the collector element and a base element 113 and emitter element 114 forming the remaining portions of the transistor. Upon the upper surface of the wafer 101 there is preferably disposed a mask 116 which serves to protect the upper surface of the wafer and also to provide electrical insulation thereat. This mask 116 may be conveniently formed as an oxide or suboxide of silicon, and extends over each of the P–N junctions which may terminate at the upper surface of the wafer 101. Appropriate openings in the mask 116 are provided by etching or other convenient means whereby electrical contacts may be made to the desired portions of the zones 102 and 103, and such other circuit elements as may be provided as a part of the semiconductor circuit complex. Thus, an electrical conductor 117 may be provided as by the plating of metal onto the upper surface of the mask 116 in extension through an opening in same into ohmic contact with the emitter 112 of the transistor 102 and also through an opening in the mask 116 into electrical contact with a conducting channel 118 formed transversely through the wafer 101 within the intrinsic barrier zone 109. This conducting channel 118 may be formed, for example, in the manner illustrated in FIG. 9 of the drawings wherein a deep level impurity such as gold is diffused through the wafer to heavily dope same and to form a highly conducting channel through the wafer. Further appropriate electrical connections may be provided, for example, to the base element 111 of the transistor 102 atop the wafer by provision of an aperture through the mask 116 and the plating of metal upon this mask and through such aperture. Likewise, a collector connection may be provided through the transistor formed of the zone 103 by the plating of metal onto the top of the mask 116 and in extension therethrough into ohmic contact with the zone 103 atop the wafer. Similar provision is made upon the under surface of the wafer for electrically insulating such portions of the electrical circuit formed of the complex as is desired, and also to provide suitable electrical connections between elements of such circuitry. Specifically there is shown an insulating and protective mask 119, formed for example of an oxide of the silicon, upon the entire undersurface of the wafer 101, with suitable openings therein for electrical connections to desired portions of the wafer. One electrical connection 121 may, for example, be formed by plating a metal onto the undersurface of the wafer 101 upon the mask 119 thereon and extending through an opening in such mask into electrical contact with the channel 118, and also through another opening in the mask into ohmic contact with the emitter 114 of the transistor formed in the semiconducting zone 103. It will be seen that the portion of an electronic circuit illustrated in FIG. 10 affords a truly unitary solid-state circuitry utilizing the semiconductor circuit complex of the present invention wherein the circuit transistors are electrically isolated from each other within the complex. It is only necessary following the provision of an electrically insulating mask upon the surfaces of the wafer 101, to apply electrical connections by plating or other convenient means to afford the desired connection between separate elements of an electronic circuit formed of the improved semiconductor circuit complex hereof. Substantially complete isolation is afforded between semiconducting zones of the invention by the provision of intermediate barriers of intrinsic or high resistance material which may be variously combined with extrinsic barriers in accordance with the various embodiments of the invention. Previous difficulities encountered in providing proper insulation and isolation between such semiconducting zones of a wafer or the like of semiconducting material are herein entirely overcome and, furthermore, the problems of manufacture formerly encountered in attempts at producing complex electronic circuitry in a solid-state unit are fully solved by the method of manufacture of the present invention.

I claim:

1. A unitary solid-state electronic circuit comprising a semiconducting wafer having a plurality of zones of extrinsic semiconducting material therein, of one conductivity type having disposed therein extrinsic semiconducting material of the opposite conductivity type, forming P–N junctions with the material of said zones, said zones being separated by intrinsic semiconducting material and isolated from each other by at least one barrier of extrinsic semiconducting material of an opposite conductivity type from the material of said zones, said barrier having a width at least in excess of the diffusion length of minority carriers therein, an electrically insulating mask disposed upon the surface of said wafer, and electrical conductors disposed on said mask and insulated from said wafer thereby and further extending through said mask at selected points thereof into electrical contact with particular portions of the devices formed by the extrinsic semiconducting material of opposite conductivity types forming a P–N junction within said zones to thereby define an electronic circuit.

2. An improved semiconductor circuit complex comprising a wafer of high resistance intrinsic semiconducting material, at least two zones of extrinsic semiconducting material of a first conductivity type disposed in said wafer, each having semiconducting material of a second conductivity type disposed thereon, forming a P–N junction with said material of a first conductivity type, said zones being separated from each other by a double barrier region, said double barrier region having a first region of intrinsic semiconducting material adjacent one of said zones and a second region of extrinsic semiconducting material of a second conductivity type disposed between said first region and the other of said zones, said double barrier region substantially entirely electrically isolating said zones from each other in said wafer.

3. An improved semiconductor circuit complex comprising a wafer of semiconductor material, at least two zones of extrinsic semiconducting material of a first conductivity type disposed in said wafer, each having semiconducting material of a second conductivity type disposed thereon, forming a P–N junction with said material of a first conductivity type, said zones being separated from each other by a multiple barrier region, said barrier region having a first region of extrinsic semiconducting material of a second conductivity type disposed between said zones, and a second region of intrinsic semiconducting material surrounding said first region and adjacent said zones, said barrier region substantially entirely electrically isolating said zones of extrinsic semiconducting material from each other in said wafer.

4. A semiconductor circuit complex comprising a wafer of high resistance intrinsic semiconducting material, and a plurality of zones of extrinsic semiconducting material of a first conductivity type disposed in said wafer and separated from each other by said intrinsic material, each of said zones having semiconducting material of a second conductivity type disposed thereon, forming a P–N junction with said material of a first conductivity type, the device, formed by the semiconducting materials of opposite conductivity type in said zone separated by said P–N junction, having separate means for making contact to it, each of said zones and said devices being electrically isolated from each other by said intrinsic material.

References Cited in the file of this patent

UNITED STATES PATENTS

| | | |
|---|---|---|
| 2,588,254 | Lark-Horvitz et al. | Mar. 4, 1952 |
| 2,708,646 | North | May 17, 1955 |
| 2,764,642 | Schockley | Sept. 25, 1956 |
| 2,772,360 | Schockley | Nov. 27, 1956 |
| 2,786,166 | Poganski | Mar. 19, 1957 |
| 2,790,037 | Shockley | Apr. 23, 1957 |
| 2,829,422 | Fuller | Apr. 8, 1958 |
| 2,842,831 | Pfann | July 15, 1958 |
| 2,869,084 | Schockley | Jan. 13, 1959 |
| 2,885,608 | Bradley | May 5, 1959 |
| 2,919,386 | Ross | Dec. 29, 1959 |
| 2,950,219 | Pohl | Aug. 23, 1960 |
| 3,029,366 | Lehovec | Apr. 10, 1962 |

Notice of Adverse Decisions in Interferences

In Interference No. 97,184 involving Patent No. 3,150,299, R. N. Noyce, SEMICONDUCTOR CIRCUIT COMPLEX HAVING ISOLATION MEANS, final judgment adverse to the patentee was rendered Feb. 26, 1973, as to claim 4.

[*Official Gazette September 4, 1973.*]